United States Patent
Marshall, III

[11] Patent Number: 5,298,137
[45] Date of Patent: Mar. 29, 1994

[54] METHOD AND APPARATUS FOR LINEAR MAGNETRON SPUTTERING

[75] Inventor: John Marshall, III, Longmont, Colo.

[73] Assignee: Surface Solutions, Inc., Boulder, Colo.

[21] Appl. No.: 955,250

[22] Filed: Oct. 1, 1992

Related U.S. Application Data

[63] Continuation of Ser. No. 688,914, Apr. 19, 1991, abandoned.

[51] Int. Cl.⁵ ............................................. C23C 14/34
[52] U.S. Cl. .......................... 204/192.12; 204/298.06; 204/298.09; 204/298.16; 204/298.22
[58] Field of Search ................. 204/192.12, 298.06, 204/298.09, 298.21, 298.22, 298.16

[56] References Cited

U.S. PATENT DOCUMENTS

| | | | |
|---|---|---|---|
| 3,838,031 | 9/1974 | Snaper | 204/192.2 |
| 3,878,085 | 4/1975 | Corbani | 204/192.12 X |
| 3,884,793 | 5/1975 | Penfold | 204/192.12 X |
| 3,919,678 | 11/1975 | Penfold | 204/298.16 |
| 3,956,093 | 5/1976 | McLeod | 204/192.12 |
| 3,995,187 | 11/1976 | Penfold et al. | 204/192.12 X |
| 4,025,410 | 5/1977 | Stewart | 204/192.12 |
| 4,030,996 | 6/1977 | Penfold et al. | 204/192.12 |
| 4,031,424 | 6/1977 | Penfold et al. | 204/192.12 |
| 4,111,782 | 9/1978 | Penfold et al. | 204/298.21 |
| 4,166,018 | 8/1979 | Chapin | 204/192.12 |
| 4,179,351 | 12/1979 | Hawton, Jr. et al. | 204/298.09 |
| 4,198,283 | 4/1980 | Class et al. | 204/192.12 X |
| 4,221,652 | 9/1980 | Kuriyama | 204/192.12 X |
| 4,243,505 | 1/1981 | Penfold | 204/192.12 X |
| 4,290,877 | 9/1981 | Blickensderfer | 204/192.12 X |
| 4,356,073 | 10/1982 | McKelvey | 204/192.12 |
| 4,362,632 | 12/1982 | Jacob | 204/298.34 |
| 4,376,025 | 3/1983 | Zega | 204/298.21 X |
| 4,407,713 | 10/1983 | Zega | 204/298.21 X |
| 4,417,968 | 11/1983 | McKelvey | 204/192.12 |
| 4,445,997 | 5/1984 | McKelvey | 204/298.22 |
| 4,588,490 | 5/1986 | Cuomo et al. | 204/298.06 |
| 4,798,663 | 1/1989 | Herkhotz et al. | 204/298.06 |
| 4,885,070 | 12/1989 | Campbell et al. | 204/298.06 X |
| 4,960,753 | 10/1990 | Collins et al. | 204/298.06 X |

OTHER PUBLICATIONS

Thorton, "High Rate Sputtering Techniques", Thin Solid Films, 80(1981) 1–11.
Thorton, "Substrate . . . Sources", Thin Solid Film, 54(1978), 23–31.

Primary Examiner—Nam Nguyen
Attorney, Agent, or Firm—James R. Young

[57] ABSTRACT

An emission enhanced sputtering magnetron apparatus includes an elongated rod or bar like cathode jacketed by a target material. An electron emission enhancement device positioned around the end of the elongated cathode creates a thin, highly uniform plasma sheath along the remainder of the cathode, thereby enhancing the sputtering rate along the entire length of the cathode target material. A low voltage, high current AC or DC magnet supply connected across the elongated cathode generates a plasma-confining magnetic field circumferentially around the entire length of the cathode. In an alternate embodiment, a single elongated tube or bar of the target material can be conformed into the cathode, the electron emission enhancing device, and a working end portion that can be formed into nearly any shape to conform to the shape of the surface being coated with the target material.

47 Claims, 7 Drawing Sheets

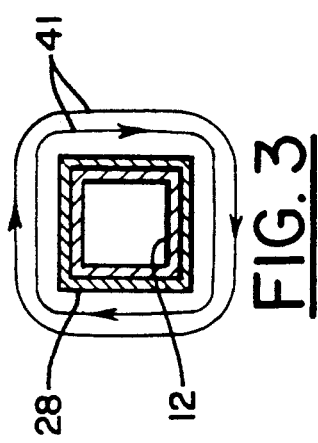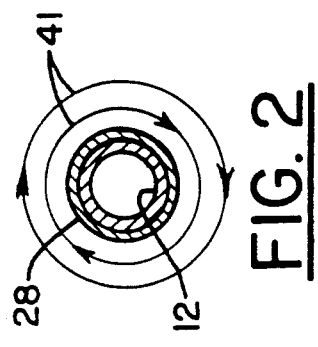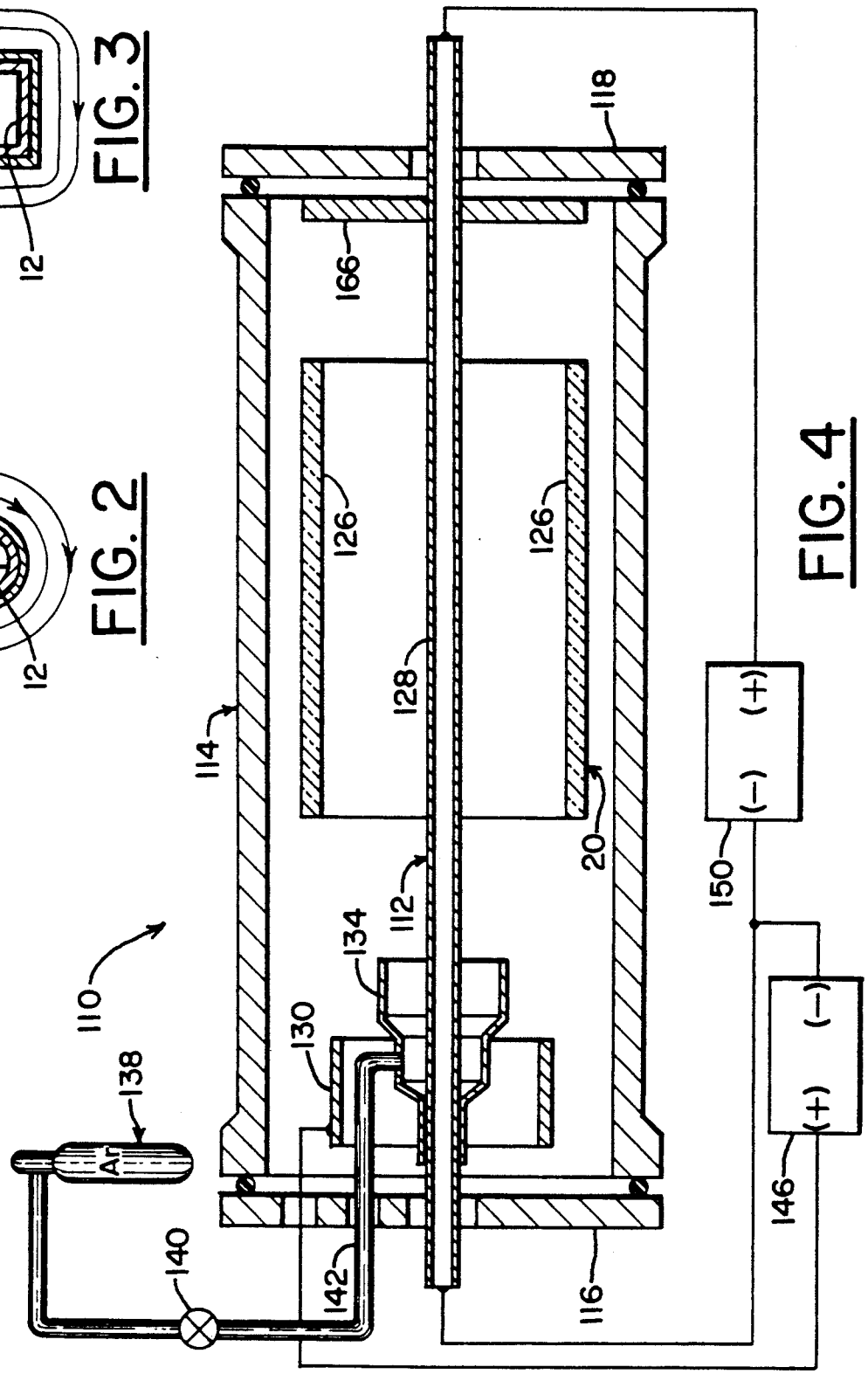

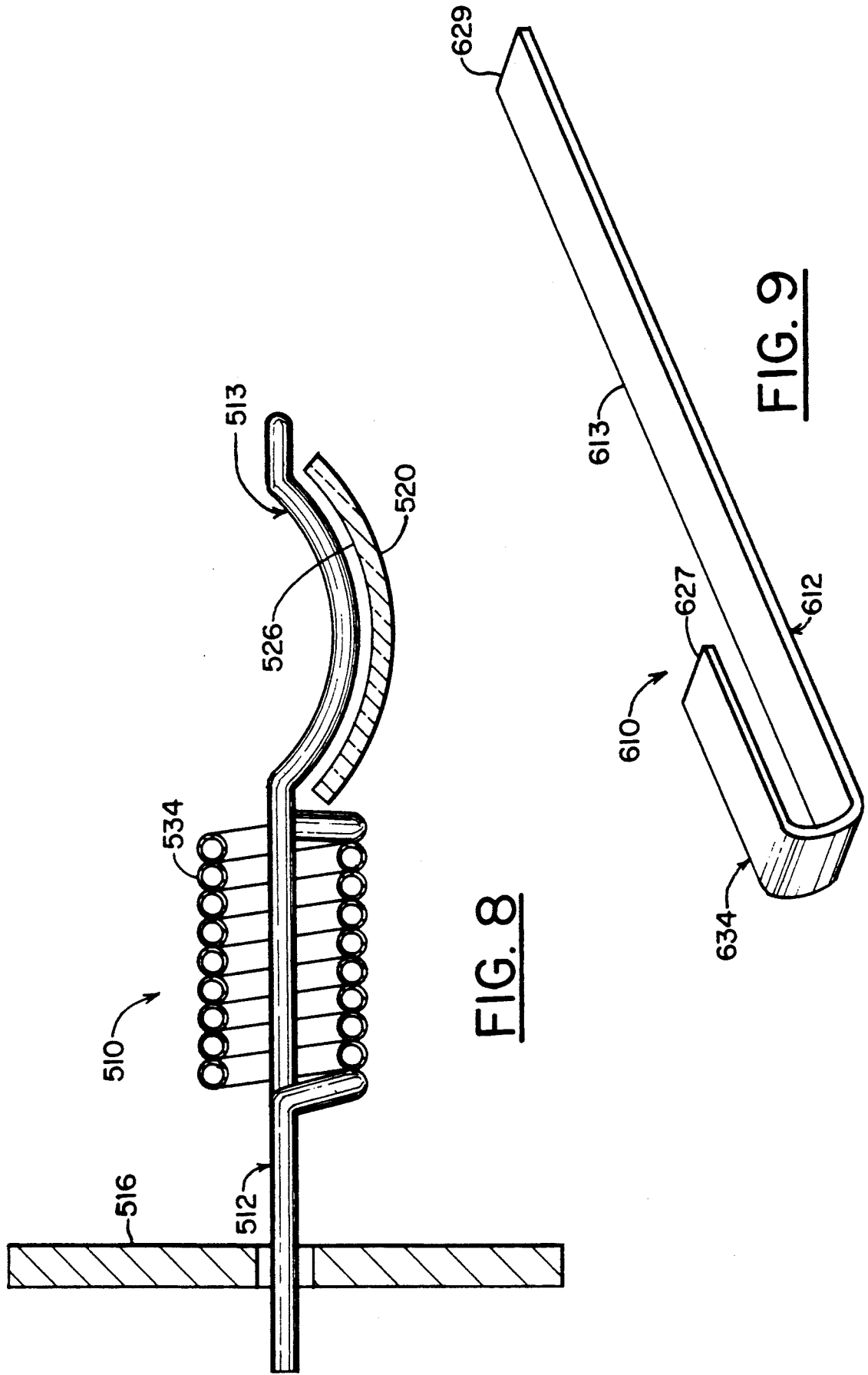

METHOD AND APPARATUS FOR LINEAR MAGNETRON SPUTTERING

This application is a continuation of application Ser. No. 07/688,914, filed Apr. 19, 1991, now abandoned.

BACKGROUND OF THE INVENTION

1. Field of the Invention

This invention relates generally to the field of magnetron sputtering and more specifically to linear magnetron apparatus for enhancing the uniformity of a plasma sheath along an elongated target to provide a uniform sputtering rate along the length of the target and to provide a uniform thin film coating on the substrate.

2. Brief Description of the Prior Art

Sputtering is a well-known process in which the surface of an object or substrate is coated with a thin film of material that is sputtered, i.e., physically eroded by ion bombardment, from a target. Sputtering is implemented by creating an electrical plasma over the surface of the target material in a low-pressure gas atmosphere. Gas ions from the plasma are accelerated by electric fields to bombard and thereby eject atoms from the surface of the target material. These atoms travel through the gas environment until they impact the surface of the object or substrate where they bond, creating a coating layer. Sputtering has most commonly been used in the semiconductor industry where thin metal coatings are formed on semiconductor substrates and then later patterned to form the various conductive contacts, interconnections, and insulating surfaces on such substrates. However, an ever-expanding variety of products are being coated by this sputtering process, including, for example, architectural glass, computer screens, sheet steel, sunglasses, automobile parts, automobile glazing, surgical implants, jewelry, tool bits, sheet plastic, fabrics, and fiber optics. Generally speaking, the articles to be coated have been of a flat or planar nature.

In a typical DC magnetron sputtering operation, a target of the material one wishes to use for a coating is placed within a low pressure gas plasma and connected as a cathode. Ions from the gas, most usually a chemically inert noble gas such as argon, bombard the surface of the target and knock off atoms of the target material. The object being coated is typically placed with respect to the cathode such that it is in the path of the sputtered atoms. Accordingly, a thin film of the material is deposited on the surface of the object. It is the nature of the sputtering process that the sputtered atoms leave the target surface with relatively high energies and velocities such that when the atoms bombard the substrate surface they actually intermix into the atomic lattice of the substrate surface, creating a penetrating tight bond.

While the overall yield of the sputtering process, that is, the number of atoms sputtered per incident ion, depends on the energy of the incident ions, the overall sputtering rate not only depends on the energies of the incident ions, but also depends on the number of ions impacting the target surface. The ion energy and number of ions are dependent on the level of ionization in the gas plasma (glow discharge) and also upon the location of this plasma with respect to the target surface. Therefore, it is desirable that the ions in the plasma be produced adjacent the target surface, so that their energies are not dissipated by collisions with intervening gas atoms.

A standard method of improving overall efficiency of glow discharge sputtering has been to use magnetic fields to confine electrons to the glow region in the vicinity of the cathode target surface. The addition of such magnetic fields increases the rate of ionization. Numerous types of magnetron sputtering apparatus, as they have come to be known, have been developed for this very purpose. Essentially, electrons emitted from the target surface will accelerate to a drift velocity that is orthogonal to both the directions of the electric field and the magnetic field as measured over the surface of the target. In almost every magnetron sputtering device, the paths travelled by these electrons close on themselves forming a closed loop. Further, the magnetic fields of such devices are typically designed such that arching lines of flux form "tunnels" through which the electrons travel at drift velocity. That is, the electrons travel generally in a "ring" or "racetrack" configuration: As they rise from the target surface, the electrons whirl around the racetrack loop in proximity to the target surface, thereby increasing sputtering rate, as discussed in the patents issued to Chapin, U.S. Pat. No. 4,166,018; Class, U.S. Pat. No. 4,198,283; McLeod, U.S. Pat. No. 3,956,093; and Corbani, U.S. Pat. No. 3,878,085.

In magnetron type sputtering devices, the efficiency of plasma generation is increased because all of the electrons caught in the magnetic field have an increased effective path length in the proximity of the target. That is, each electron emitted from the target surface has a much longer distance of travel while in the proximity of the target. The result is that the electrons have collisions with much higher numbers of gas atoms while near the target. Accordingly, the resultant higher intensity plasma has more ions available to bombard the surface resulting in a higher sputtering rate. Another method of increasing the sputtering rate is described by Cuomo in U.S. Pat. No. 4,588,490. Essentially, Cuomo adds an additional electrode, known as a hollow-arc cathode as a third and separately biased electrode to increase the numbers and energy of electrons generally available in the vicinity of the target. However, a disadvantage associated with the addition of such a hollow cathode is that the hollow cathode must be made of refractory metal because it operates at extremely high temperatures. Another disadvantage associated with Cuomo's hollow cathode is that it must be operated with a gas flow through the arc cathode that needs to be appropriately controlled for proper operation. Yet another disadvantage is the need for an additional high-current biasing supply that must be set at an appropriate biasing level. In general, Cuomo does achieve higher rates because he is working in the right direction; higher rates are achieved by a "hotter" plasma most proximate to the cathode surface. However, this increased sputtering rate comes at the expense of a relatively large increase in the number of additional components and complex control apparatus.

Magnetron sputtering systems can be classified into various groups. Principal among these groups are the circular, planar, and cylindrical types of sputtering apparatus. Circular and planar magnetron apparatus tend to suffer from non-uniform erosion which renders the target unusable even when relatively large amounts of useful target material still remain. This non-uniformity of erosion is a direct result of the "racetrack" effect described above. That is, the plasma is more intense over the racetrack area and sputters the target material directly below the racetrack at a vastly greater rate than the portions not directly below the racetrack. After this portion of the target material is eroded away, the target must be replaced even though material remains at the center and at the edges of the racetrack so that the device will not sustain damage to the supporting cooling structure. Since many sputtering applications require expensive high purity target materials, this is an uneconomic and wasteful circumstance. Actually, any of the current sputtering devices having a closed flux-tunnel electron loop or racetrack configuration will suffer non-uniform target erosion, since the plasma concentration necessarily varies over the surface of the target. Another disadvantage of circular and planar magnetrons is that they tend to have quite bulky magnet structures making them large and cumbersome. Because of this bulky structure, such magnetrons are generally useless for creating uniform films inside concave or cylindrical structures.

Several different types of cylindrical magnetron sputtering devices have been developed in part to solve the non-uniformity problems associated with the circular and planar devices, as described above. Basically, the target material in a cylindrical device is in the form of an elongated tube. Confining magnetic fields are usually provided by complex bulky solenoid coils disposed within the target around the outside of the magnetron chamber as described in the patents issued to Penfold, U.S. Pat. Nos. 3,884,793 and 4,031,424. Penfold uses solenoidal coils to generate magnetic fields having flux lines parallel to the axis of the elongated cathode target. Such cylindrical magnetrons tend to be somewhat more even in their erosion patterns, however, they suffer from undesirable end effects. That is, in a cylindrical magnetron the direction of the electron drift velocity vector causes the electrons to orbit around a central target post. Unfortunately, however, the electrons tend to leak out or escape their orbits near each end of the central post, resulting in lower ionization intensities, thus lower sputtering rates, at each end of a cylindrical target. Further, such cylindrical magnetrons are also expensive to construct and are not suitable for coating substrates with large planar surface areas. Another disadvantage associated with the cylindrical magnetrons disclosed by Penfold is that the elongated target may not be bent or shaped to follow the contours of irregularly shaped objects. If the target in a cylindrical magnetron, such as that described by Penfold, is bent or shaped to follow the contours of an irregularly shaped object, the magnetic field strength over the target surface would not be uniform, resulting in marked non-uniformities in the plasma sheath, thus, the sputtering rate, along and around the surface of the target. Further, because the magnetic field is axially oriented and parallels the longitudinal axis of the elongated cathode of the target assembly, it is difficult, if not impossible, to reshape the magnetic field so that it maintains the necessary uniform field strength over the curved or bent target surface. Accordingly, such cylindrical sputtering devices utilizing axially oriented magnetic fields are not useful in uniformly coating irregularly shaped objects. McKelvey, U.S. Pat. No. 4,445,997, realizes a fix for a somewhat non-planar surface, but his solution to the problem is a device with multitudes of parts and a target surface that would be very expensive to form with high-purity materials. Finally, a further disadvantage of these types of cylindrical sputtering devices is that they are not useful for coating the inner surfaces of small diameter magnetic steel tubing, because the magnetic field produced by the solenoid outside of the tube cannot penetrate into the internal regions of the tube.

The patent issued to Zega, U.S. Pat. No. 4,376,025, attempts to solve some of the problems associated with the above-described cylindrical magnetron sputtering apparatus by reorienting the magnetic flux lines circularly around the axis of the elongated rod-like target material, as opposed to the axial orientation used by Penfold. Essentially, Zega discloses a cylindrical magnetron device utilizing a tubular current-carrying electrode disposed within a tubular target cathode. Instead of using a separate solenoid coil to generate the plasma-confining magnetic field, Zega uses a high-current carrying hollow electrical conductor disposed within a tubular target to generate a circumferential magnetic field that surrounds the tubular target. Zega presents data that show the device achieves very poor uniformity of coatings. There is some improvement gained by the use of AC driving potential for magnetic field generation, however, even depositions of coating are still not possible. A further disadvantage of Zega's device is that his cylindrical magnetron is still not useful for coating large planar surfaces. Unlike the prior art magnetrons, the Zega magnetron, despite its poor sputtering uniformity, does not depend on a closed-loop flux tunnel.

Corbani, U.S. Pat. No. 3,878,085, did try to make a similar embodiment work for coating of planar surfaces. One of his patent embodiments shows a magnetron structure that is open-ended with no looped magnetic field. He complains, however, that "the embodiment of FIG. 6 has the disadvantage that its path has a beginning and an end, and that charged particles will be ejected from the end. Also, since there is a beginning, sputtering will not occur for an initial length of the path, and part of the device is not functional for generation of sputtered material."

The disadvantage of Corbani's device is that it produces sputtering rates of different magnitudes longitudinally along the surface. In operation, then, Corbani's device would give a rate curve similar to that shown in FIG. 2a of Zega's U.S. Pat. No. 4,376,025.

In summary, none of these prior art DC magnetron sputtering devices are capable of achieving a uniform sputtering rate over the entire surface of an irregularly shaped target without going to great pains and expense, such as in the device disclosed by McKelvey. There is a great need for an inexpensive device that could be simply fashioned to coat such surfaces. However, to do so would ideally require a target that is shaped to "silhouette" the object so that the object being coated can be brought adjacent the target in such a way that the distance between all points on the surface of the object and the target are substantially equal. Unfortunately, prior art sputtering devices had to go to extreme expense and complexity, sometimes sacrificing target use or power efficiency and almost always introducing a large number of parts with a great surface areas into the vacuum system, thus increasing the overall cost and complexity of the system. Moreover, large surface areas and great numbers of parts are antithetical to the creation of quality-high purity films in that they tend to poison the sputtered film with unwanted impurities.

Furthermore, the aforementioned prior art devices tend to have relatively large targets of much greater lengths or diameters than would otherwise be necessary if such devices could achieve a highly uniform plasma sheath over the target surface to provide at least an acceptable degree of uniformity of the film deposited onto the substrate.

Therefore, there remains a need for a sputtering apparatus that is capable of uniformly and efficiently depositing a thin film of the target material on objects having various shapes, such as the inner surface of crucibles, the inner diameters of cylinders, shaped automobile glazing, and radically curved lenses. Such an apparatus should achieve a uniform and intense plasma sheath evenly over the full surface of the target to achieve uniform erosion and high sputtering rates. Further, such an apparatus should have a target that can be easily placed in close proximity to the surface being coated to increase the deposition efficiency and alleviate the problems caused by target atoms being sputtered on objects in the vacuum system other than the substrate. Ideally, such a sputtering apparatus should allow a wide variety of shapes, sizes, length, and widths of target cathode surface to be used while maintaining uniform fluxes of sputtered atoms along the entire length of the target cathode surface. Such a sputtering device should also be efficient, have a reasonable freedom from generating contamination and particulates and still be relatively easy and inexpensive to manufacture. Prior to this invention, no such sputtering device existed.

SUMMARY OF THE INVENTION

Accordingly, it is a general object of this invention to provide a sputtering device that achieves a uniform sputtering rate over the entire surface of the target.

It is another general object of this invention to provide a sputtering device capable of depositing a very uniform coating on the surface of the object being coated.

It is a further general object of this invention to provide a magnetron sputtering device wherein the target can be conformed to a wide variety of shapes while maintaining a uniform plasma sheath over the entire length of the irregularly shaped target.

It is yet another general object of this invention to provide a magnetron sputtering device that can be used with equal effectiveness with AC or DC currents to create the confining magnetic field.

It is a specific object of this invention to provide a magnetron sputtering device that achieves uniform deposition over planar surfaces.

It is another specific object of this invention to provide a magnetron sputtering device having a close fitting plasma sheath over a curved or bent elongated target to produce high sputtering rates with a high degree of uniformity over the entire length of the curved or bent elongated target.

It is a further specific object of this invention to provide a magnetron sputtering device that achieves a uniform plasma sheath and uniform sputtering rate by using an electron emission enhancing device.

It is yet a further specific object of this invention to provide a magnetron sputtering device that can be used at very close working distances for achieving high sputtering rates and target material utilization while maintaining a uniform coating of sputtered target material on the object being coated.

It is another further specific object of this invention to reduce the flux of emitted splattered large sized particles.

It is still another further specific object of this invention to provide a magnetron sputtering device that can be used to coat the outer surfaces of pipe, thread, rod, wires, fiber optics, and other elongated or tube like materials.

It is yet another specific object of this invention to provide a magnetron sputtering device that can be used to sputter impurities from the inner surfaces of pipes or tubing having very small diameters.

Another specific object of this invention is to provide a magnetron sputtering device that achieves high sputtering rates, even when used with magnetic materials.

Another object of this invention is to eliminate many of the parts and large surfaces that must be contained within the vacuum sputtering chamber as well as to minimize the number of rotary feedthroughs and mechanical gearings that must pass through the vacuum chamber walls.

Additional objects, advantages, and novel features of the invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the emission enhanced linear magnetron apparatus of this invention includes an elongated cathode surrounded by a target material. The target material may either be a sleeve, or a wire wound around the elongated cathode, if the cathode is rod-like, or the target material could be a welded sheet or a plate attached to or fastened around an elongated cathode having another shape. Alternatively, and in either case, the cathode may be made entirely of the target material. An electron emission enhancement device positioned near the front end of the elongated cathode enhances the emission of electrons by the cathode to create a highly uniform plasma sheath and sputtering rate along the entire length of the target material. A low voltage, high current AC or DC magnet supply connected across the elongated cathode generates a plasma-confining magnetic field around the entire length of the cathode to further enhance efficiency. If an AC magnet supply is used, an electron emission enhancement device must be positioned at each end of the elongated cathode. In an alternate embodiment, a single elongated tube of target material can be conformed into a cathode, an electron emission enhancing device and a working end. The working end can be formed into nearly any shape to conform to the shape of the surface being coated with the target material.

The method of this invention includes the steps of providing an elongated cathode and target and an anode in a sputtering chamber, enhancing the emission of electrons by the cathode, applying an electric current through the elongated cathode to generate a coaxial magnetic field around the elongated cathode, and generating a tight thin plasma sheath around the target.

BRIEF DESCRIPTION OF THE DRAWINGS

The accompanying drawings, which are incorporated herein and form a part of the specification illustrate preferred embodiments of the present invention, and together with the description, serve to explain the principles of the invention. In the drawings:

FIG. 2 is a schematic elevation cross-section view of a target material coating cathode having a cylindrical cross-section and showing how the magnetic field lines encircling the target material confine the plasma adjacent the target material;

FIG. 3 is a schematic elevation cross-section view of a target material coating cathode having a square or rectangular cross-section and showing how the magnetic field lines encircling the target material confine the plasma adjacent the target material;

FIG. 4 is a schematic elevational cross-sectional view of a second embodiment of a linear magnetron sputtering apparatus according to the present invention showing the elongated rod-like cathode, the coaxial hollow cathode electron enhancer, and a single anode encircling the coaxial hollow cathode electron enhancer;

FIG. 8 is a schematic elevational cross-sectional view of a second embodiment of the special configuration cathode shown in FIG. 7, but having a working portion curved to substantially follow the contour of the curved surface of the object being coated;

FIG. 9 is a perspective view of another special configuration cathode, wherein one end of the elongated cathode is bent back on itself, forming a "U" section hollow cathode electron enhancer.

DETAILED DESCRIPTION OF THE PREFERRED EMBODIMENT

Figure 1:
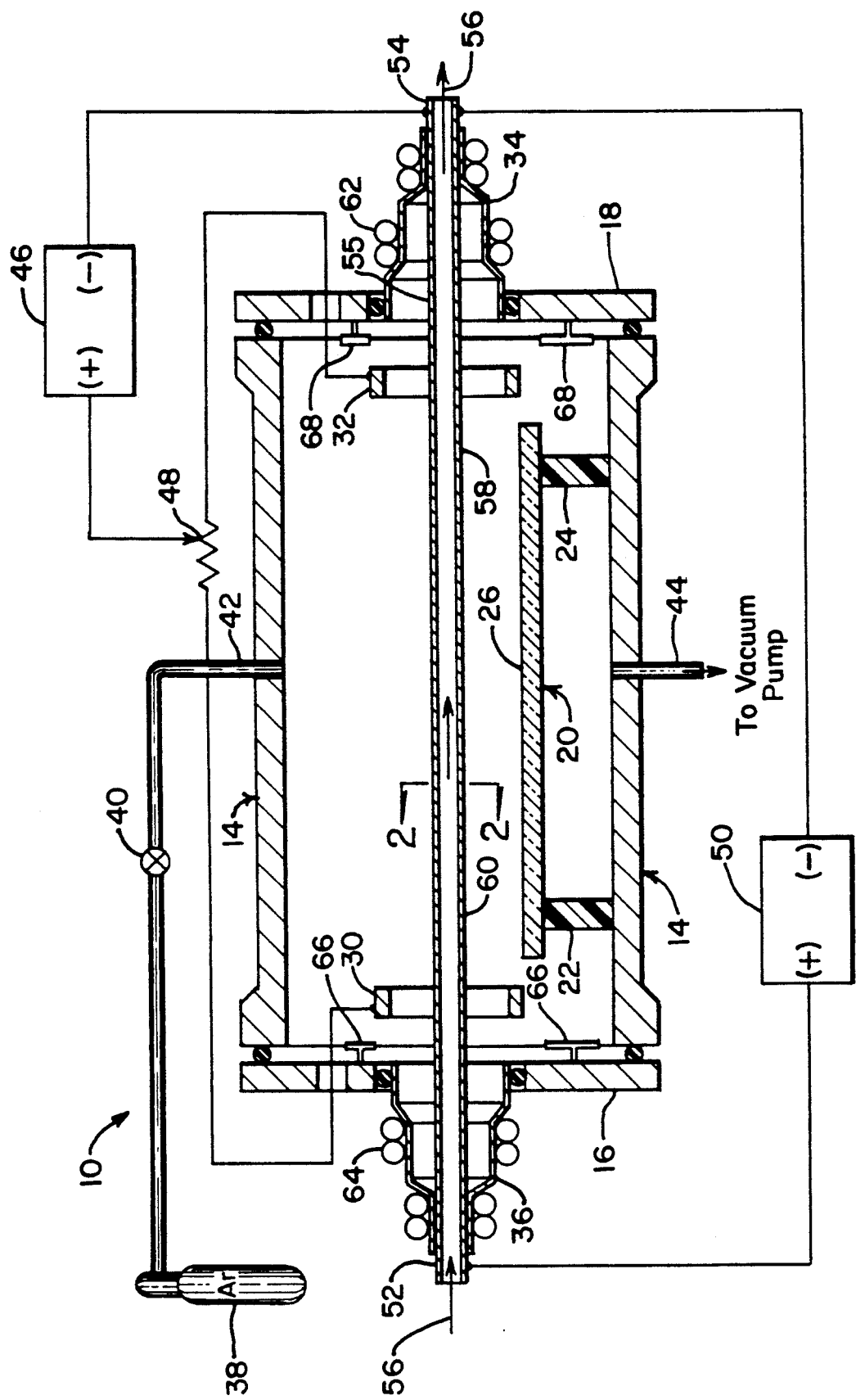
FIG. 1 is a schematic elevational cross-sectional view of a first embodiment of a linear magnetron sputtering apparatus according to the present invention showing the elongated rod-like cathode, the coaxial hollow cathode electron enhancer, the end terminator shell, and two trimming anodes.

A linear magnetron sputtering apparatus 10 according to the present invention is shown in FIG. 1 and comprises an elongated, rod-like cathode 12 positioned axially in a vacuum chamber defined by cylindrical wall 14 and opposite end walls 16, 18. A planar piece of glass 20 that is to be coated is positioned on supports 22, 24 within the vacuum chamber adjacent cathode 12, so that the surface 26 of glass substrate 20 can be coated with the sputtered metal. The source of the metal material to be sputtered is the target 28, which can either be a sleeve or a thick coating of the metal material on the exterior surface of elongated cathode 12. Alternatively, target material 28 may be a wire wound around cathode 12, or target material 28 may be a welded sheet or plate-like surface connected to cathode 12. A pair of annular "trimming" anodes 30, 32 may be optionally positioned around each end of cathode 12, to trim or finely adjust the density of the plasma sheath surrounding the target 28, as will be described below. An electron emission enhancing device, such as coaxial hollow cathode 34, is located at the "beginning" or front end 55 of cathode 12, also as will be fully described below. An end terminator 36 is located at the opposite end of cathode 12. A suitable sputtering gas, such as argon 38 is introduced into the vacuum chamber via valve 40 and inlet pipe 42. Suitable vacuum pump apparatus (not shown) connected to outlet pipe 44 maintains the pressure within the sputtering chamber at a predetermined level.

In operation, the sputtering chamber is evacuated, and argon gas 38 is fed through inlet pipe 42 into the vacuum or sputtering chamber. A high voltage from sputtering power supply 46 is connected to cathode 12 and to both trimming anodes 30, 32, via voltage divider 48, as will be thoroughly described below. Alternatively however, as will become apparent below, trimming anodes 30, 32, may be discarded, and the outside wall 14 of the sputtering chamber may be used as the anode, or the object itself may be used as the anode, as will be shown and described below. However, for the purposes of continuing this description, it is assumed that the trimming anodes 30, 32 are used. This high voltage between cathode 12 and anodes 30, 32 creates a glow discharge and plasma in the argon gas adjacent the target surface 28 on cathode 12 forming a plasma sheath around target material 28. Essentially, electrons are discharged at high energies from the cathode 12 into the argon gas 38 to create the plasma in which the argon atoms are stripped of electrons and ionized. These highly excited ionized argon atoms from the plasma accelerate toward the cathode 12 and bombard the target material 28 to sputter or erode atoms from the target 28. These sputtered atoms from target 28, also quite high in energy, migrate to the surface 26 of object 20, where they embed and plate themselves onto the surface 26. Meanwhile, the spent, now low energy electrons from the plasma migrate to the anodes 30, 32 to complete the plasma-generating electric circuit.

To enhance the sputtering efficiency and to prevent the high energy ions in the plasma from eroding other surfaces, including the surface 26 of object 20 being coated, it is highly desirable to confine the glow discharge and plasma sheath to the area immediately surrounding the target material 28 on cathode 12. Such confinement of the glow discharge and plasma sheath is accomplished by using cathode 12 as an electrical conductor to create a magnetic field in addition to the conventional and well-known use of the cathode 12 in sputtering as a pole and electron source in the high voltage electric field that creates the plasma. This additional or dual use of the cathode 12 also as a low voltage, high current conductor to create a magnetic field that encircles (circumferential magnetic field vectors $\bar{B}$) the cathode 12, and, consequently, target material 28 is unique and is an important feature of this invention. To implement this dual function of the cathode 12 as both a high voltage pole and electron source for generating a sputtering plasma and as a low voltage, high current conductor to create a concentric magnetic field with magnetic vectors $\bar{B}$ wrapped circumferentially around the cathode 12, two distinct and independent electric circuits are connected to the cathode 12, as shown in FIGS. 1, 4, 5, and 6. The conventional high voltage sputtering circuit powered by high voltage power supply 46 is connected to the cathode 12 and anodes 30, 32 as described above. The additional low voltage, high current circuit for creating the unique circumferential magnetic field vectors B concentrically around the cathode 12 according to this invention includes the low voltage, high current magnet power supply 50 connected to opposite ends of cathode 12, which causes a high current to flow axially through cathode 12. This current flowing axially through cathode 12 is in addition to, but functions independently of, the conventional high voltage sputtering circuit that was described above, and the magnetic field with lines of force or vectors $\vec{B}$ wrapping concentrically around the cathode 12 according to fundamental electromagnetic principles and as illustrated in FIGS. 2 and 3. In the preferred embodiment, it is preferred that the strength of the magnetic field generated around the target be at least about 250 gauss as measured from a point about 1 mm above the surface of the target. As is well known, the electric field $\vec{E}$ created by the conventional high voltage between an anode and the target/cathode acting in combination with a magnetic field causes electrons within the glow discharge created by the high voltage circuit to gain a net velocity, with the magnitude and direction of the electron velocity vector being given by the vector cross product of the electric field vector E and the magnetic field vector $\vec{B}$. This electron velocity is also known as the $\vec{E} \times \vec{B}$ drift velocity. The predominate electron path defines the portion of the target material that will be sputtered. In the linear magnetron according to the present invention, therefore, the combination of unique concentric magnetic field with its field vectors $\vec{B}$ wrapped circumferentially around cathode 12 and the accompanying high-voltage electric field $\vec{E}$, is different that the low voltage, magnetic field inducing, axial flowing electric current in cathode 12, confines the high voltage induced, plasma-generating electron flow (i.e. the $\vec{E} \times \vec{B}$ velocity to essentially a spiral pattern with a slight radial component, but mostly an axial component, around the cathode 12, thus confining the glow discharge and plasma sheath to a fairly tight area around the target material 28. Finally, as was briefly mentioned above, and as will be thoroughly described below, the coaxial hollow cathode 34 located at the beginning or front end 55 of cathode 12, serves to enhance the emission of electrons at the cathode 12, raising the electron drift current to a saturated level such that it stays constant within the plasma sheath surrounding the surface of the cathode 12. This saturated electron drift current results in uniform ion generation over the entire cathode 12, thus target material 28, thereby producing highly uniform sputtering rates of the target 28 regardless of whether cathode 12 is curved or bent into irregular shapes, as will be completely described below.

The primary advantage in using an electron emission enhancer, such as coaxial hollow cathode 34 in combination with the magnetic field that surrounds the cathode 12, is that highly uniform sputtering rates can be easily achieved along the entire length of the cathode 12, even with a DC magnetic field current. Further, since cathode 12 is used to generate the magnetic field, cathode 12 can be formed into a variety of shapes to provide close sputtering coupling, thus high deposition efficiency, with irregularly shaped planar objects, without affecting the uniform and tight plasma sheath surrounding the cathode. That is, the plasma sheath substantially follows any bends or curves in cathode 12. Finally, it is important to note that the linear magnetron sputtering apparatus according to this invention does not require a closed loop field to achieve uniform sputtering at high rates. For example, an elongated cathode loop, such as the one shown in FIG. 7, can be easily used to coat the inside surface of a blind-end pipe, as will be described in detail below.

Referring again to FIG. 1, with occasional reference to FIGS. 2 and 3, the linear magnetron sputtering apparatus 10 according to the present invention is described in detail. As was briefly described above, the sputtering target 28 is integral with cathode 12, so that the target 28 follows any bends or contours in the cathode. Target 28 may be either a sleeve or a thick coating of the metal material on the exterior surface of the cathode 12. Alternatively, cathode 12 may entirely comprise target material 12. For example, if the target material 28 is copper, cathode 12 may simply be a length of copper tubing. Finally, water, or some other liquid or gas coolant may be optionally introduced through open end 52 of cathode 12, flowing through the cathode and out through exit end 54, in the direction of arrows 56. See FIG. 1.

As was briefly described above, magnet current from magnet power supply 50 flows axially down cathode 12 and creates a magnetic field having flux lines 41 that substantially encircle cathode 12 and target 28, as is best seen in FIG. 2. Note that the magnetic flux lines 41 shown in FIG. 2 would encircle the cathode/target in the opposite direction, i.e., in the clockwise direction, if the low voltage magnet current from low voltage power supply 50 was flowing through the cathode 12 was reversed, as would be obvious to persons having ordinary skill in this art. Therefore, the linear magnetron according to the present invention should not be regarded as being limited to any particular field direction, so long a the magnetic field vectors $\vec{B}$ are oriented circumferentially around, not parallel to, the cathode/target. Note also that the cathode and target may be of almost any desired cross-section. For example, the cross-section of the cathode 12 and target 28 may be square or rectangular, and the flux lines 41 of the magnetic field will substantially conform to that cross-section, as shown in FIG. 3. If a DC magnet current supply is used, the negative pole or terminal of magnet power supply 50 is connected to cathode 12 at end 54, with the positive terminal being connected to end 52. With this polarity, end 54 of cathode 12 is the beginning end, and coaxial hollow cathode 34 then functions as the electron enhancer. Finally, cathode 12 is also connected to the negative terminal of high voltage sputtering supply 46 and the positive terminal of high voltage sputtering supply is connected to anodes 30 and 32 via voltage divider 48. With both supplies 46 and 50 energized and with an argon pressure of about $5 \times 10^{-2}$ torr, an intense glow discharge and plasma sheath forms evenly over the elongated target 28.

In operation, a very large emission of electrons is created over the front end portion 55 of target material 28 that is surrounded by coaxial hollow cathode 34, which is also in physical and electrical contact with cathode 12. Therefore, the front end portion 55 of cathode 12 forms the inner electrode of coaxial hollow cathode 34. Accordingly, hollow cathode 34 serves as a source of electrons and photons to enhance the emission of electrons at the front end portion 55 of target 28. This extra electron enhancement at the front end 55 of cathode 12 increases the electron drift current to saturation, such that the drift current remains constant within the plasma sheath over the surface of target material 28. In other words, the current in the plasma sheath is raised to a high enough value to establish a limiting, i.e., constant, current in the plasma sheath. Only when this limiting condition is achieved is it possible to produce a plasma sheath having uniform thickness and density, thus establishing a uniform sputtering rate along the entire length of the target material 28.

In practice, it has been found that a six (6) inch length of the coaxial hollow cathode 34 is sufficient where both the target material 28 and hollow cathode 34 are copper and where the sputtering gas is argon. However, the emissivity of the target material 28 depends on the particular target material, surface impurities, gas pressures, and the partial pressures of any reactive gasses present in the sputtering chamber. Therefore, it may be necessary to adjust the length of the hollow cathode 34 to achieve a uniform plasma sheath. Alternatively, a solenoid or coil of wire (not shown) can be wound around hollow cathode 34 to stimulate the emission of even more electrons. That is, increasing the current in such a solenoid will increase the electron emission of the cathode 12 until the sputtering rate is again equal at all points, such as points 58 and 60, along target material 28.

Therefore, for the purposes of this invention, a hollow cathode electron emission enhancer may be considered to be any portion of the cathode/target material, or any other suitable material, either at the cathode electrical potential, or some other electrical potential, that is positioned a radially spaced distance from the beginning end of the cathode so that it presents an opposed surface area that is at least partially exposed in radial relation to the beginning end of the cathode/target. Numerous different configurations of hollow cathodes according to the present invention and consistent with the foregoing definition, are, therefore, possible. By way of example and as will be explained in greater detail below, a hollow cathode may comprise a hollow cylindrical "shell" (FIGS. 1, 4, 5, and 10), a plate positioned a spaced distance from the beginning end of the cathode (FIG. 6), a portion of the elongated cathode itself that is coiled around the beginning end of the cathode (FIGS. 7 and 8), or a portion of a flat, bar-like cathode that is bent back upon itself (FIG. 9).

Advantageously, the relative sputtering rate at any point along the target 28 can be optically monitored during the sputtering operation by measuring the thickness of the plasma sheath over the surface of target 28. For example, an optical micrometer telescope system can be used to determine the plasma sheath thickness at any point along the target 28. If any difference is detected, the current in the optional solenoid wound around hollow cathode 34 can be adjusted as described above to achieve a uniform plasma sheath. Alternatively, a voltage divider 48 connected to trimming anodes 30 and 32 can be adjusted to change the relative potentials between the trimming anodes 30 and 32 and cathode 12 to precisely adjust the plasma thickness, thus sputtering rate. In some instances, the electron emission associated with hollow cathode 34, as well as the electron absorption by end terminator 36 will excessively heat these components, necessitating the addition of cooling coils 62 and 64 surrounding coaxial hollow cathode 34 and end terminator 36, respectively.

Finally, in this embodiment, it is preferred that the end walls 16, 18 be non-conductive, so that the cathode 12 may be run at a different potential from the walls 14 of the sputtering chamber, which chamber is usually grounded for safety. Therefore, annular sputter shields 66, 68 are placed circumferentially around hollow cathode 34 and end terminator 36 to insure that a conductive sputtered film does not form a continuous conductive path between the hollow cathode 34 or end terminator 36 and walls 14.

Another advantage of the magnetron sputtering device 10 shown in FIG. 1 is that it can be used with either a DC magnet power supply, as was described above, or with an AC supply. If an AC magnet supply is used, the coaxial hollow cathode 34 and end terminator 36 will alternate their functions. That is, during the first half of the AC cycle, shell 34 might be the end terminator while shell 36 is the emission enhancer, and vice-versa. Therefore, the apparatus 10 according to the present invention is readily adaptable for either AC or DC operation, without the need to change or replace any components. Finally, this magnetron sputtering device 10 permits the deposition o ferromagnetic target materials at a rate approximately equivalent to that achievable with non-ferromagnetic conductive target materials.

A second embodiment 110 of a linear magnetron sputtering device for DC operation only is shown in FIG. 4 being used to coat the inside surface of a cylindrical object. Essentially, the cathode 112 coated with target material 128 is positioned in a sputtering chamber defined by cylindrical wall 114 and opposite end walls 116 and 118, just like the first embodiment 10. The cylindrical object 120 is positioned in the sputtering chamber concentrically around the cathode 112, so that the inside surface 126 of the substrate 120 can be coated with the target material 128. In this second embodiment, however, a single annular anode 130 surrounds coaxial hollow cathode 134. Argon gas 138 is introduced into the sputtering chamber through coaxial hollow cathode 134. An end shield 166 is positioned around the opposite end of cathode 112 to protect the adjacent end wall 118 from sputtering damage. The operation of this second embodiment 110 is essentially identical to the first, except that only DC magnetic field currents can be placed on cathode 112, because there is not an opposing end terminator that can function as a coaxial hollow cathode for the half of the AC cycle having reversed polarities.

Figure 5:
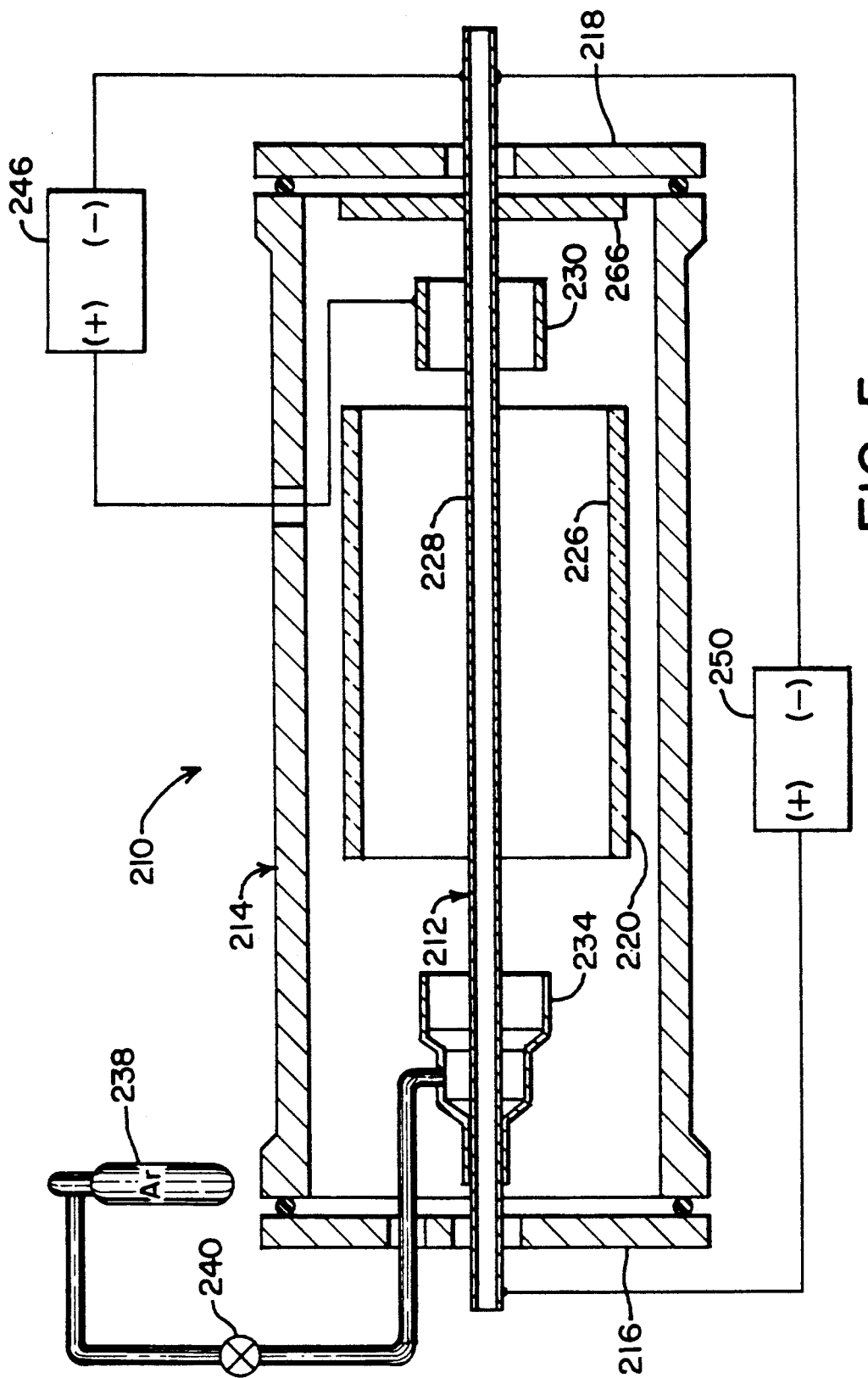
FIG. 5 is a schematic elevational cross-sectional view of a third embodiment of a linear magnetron sputtering apparatus according to the present invention showing the elongated rod-like cathode, the coaxial hollow cathode electron enhancer, with a single anode disposed at the opposite end of the sputtering chamber.

A third embodiment 210 of a linear magnetron sputtering device, again for DC operation only, is shown in FIG. 5. Essentially, this third embodiment 210 is the same as the second embodiment 110, except that the anode 230 is located at the opposite end of the sputtering chamber. When this anode 230 is relocated, as in this embodiment 210, the positive terminal of magnet supply 250 should be connected to the end of the cathode 212 containing the coaxial hollow cathode 234. As with the second embodiment 110, this third embodiment 210 can on be operated with a DC magnet current.

Figure 6:
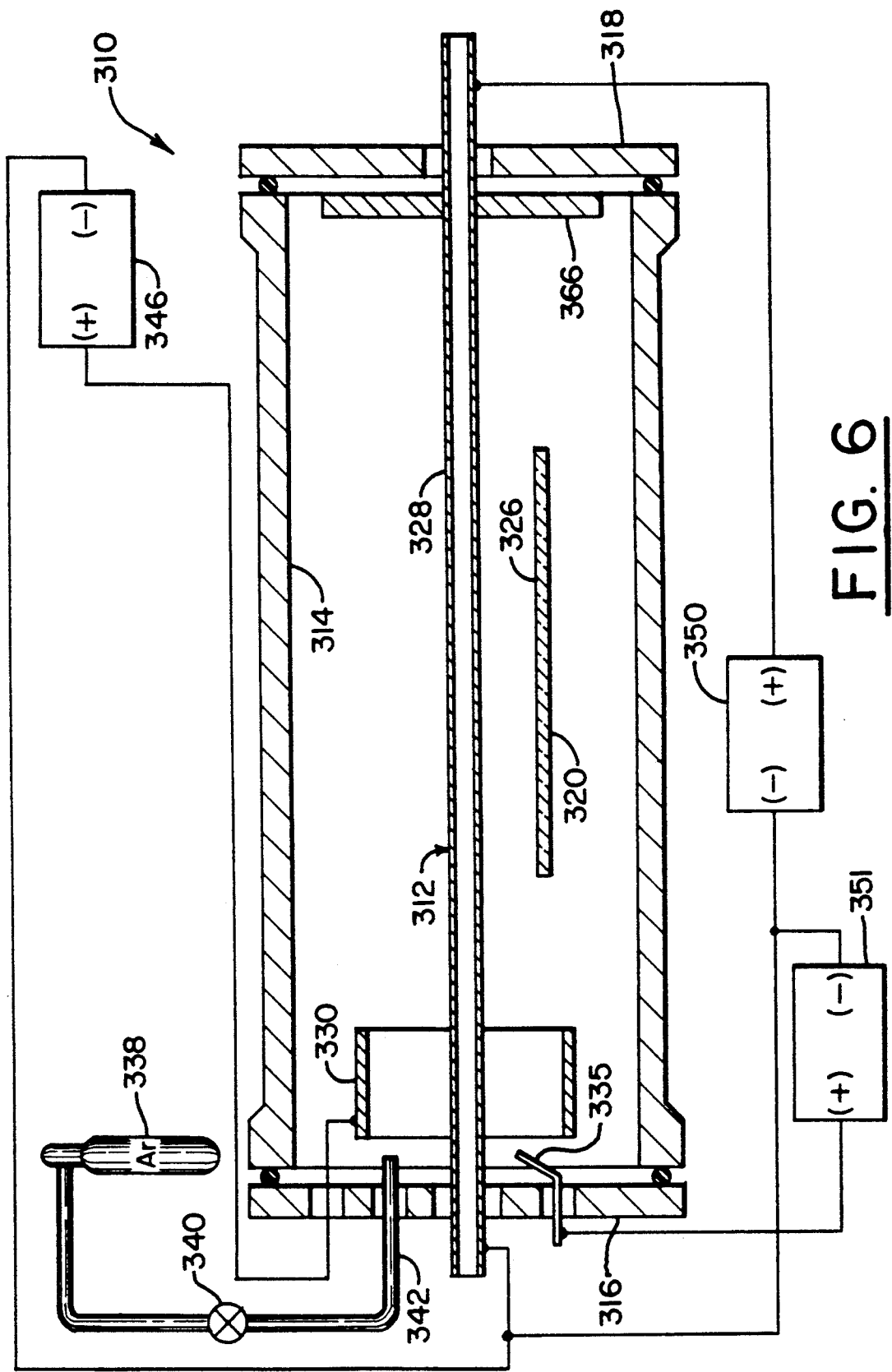
FIG. 6 is a schematic elevational cross-sectional view of a fourth embodiment of a linear magnetron sputtering apparatus according to the present invention, similar to the embodiment shown in FIG. 4, but having an alternate flat plate electron enhancer connected to a separate electron source power supply.

A fourth embodiment 310 of yet another DC linear magnetron sputtering device is shown in FIG. 6. This fourth embodiment 310 uses a different type of electron emission enhancer to provide electron enhancement in the plasma. This plate type of emission enhancer 335 is essentially a flat plate that is connected to an additional electron source power supply 351.

Figure 7:
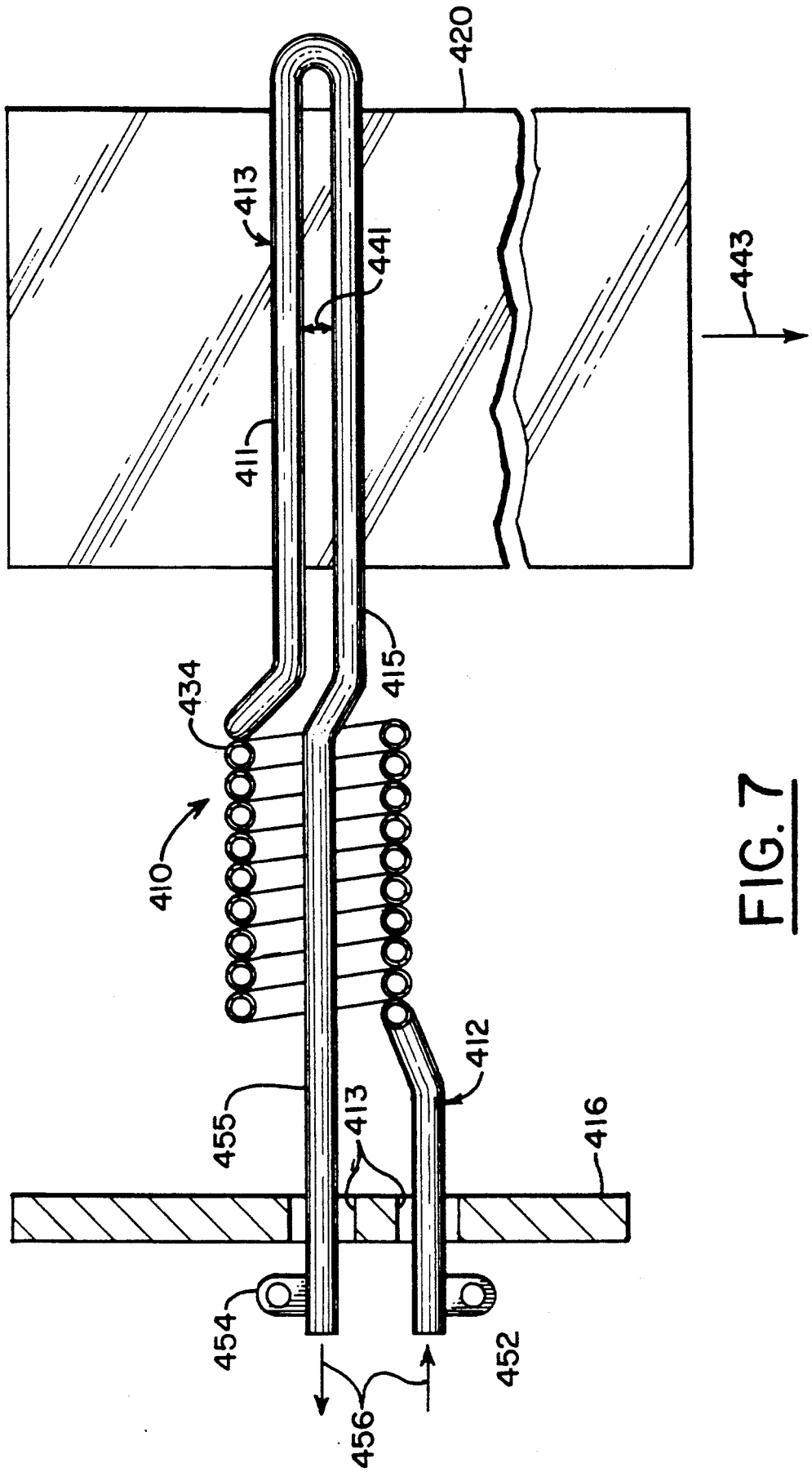
FIG. 7 is a schematic plan view of a special configuration cathode for coating large planar surfaces having an integral coaxial hollow cathode electron enhancer.

While the above-described embodiments have all been shown and described utilizing straight, rod-like targets, a nearly infinite variety of target shapes are possible, since the plasma sheath will closely follow any contours, bends, or curves of the elongated target. The target can even be folded back on itself to form a loop. For example, a special configuration 410 of a combination cathode and target 412 loop according to the present invention is shown in FIG. 7. This configuration of the combination cathode and target 412 would be useful in coating large, planar surfaces, such as large glass plates. The plate 420 could be passed under or over the working portion 413 of combination cathode/target 412 in a direction parallel to the plane of the paper as indicated by arrow 443. The elongated working portion 413 can be of any length, and preferably would be as long as the object being coated. Since the object can easily be drawn past working end 413 in close proximity, deposition efficiency will be relatively high, with the majority of the sputtered target atoms coating the surface of the planar object. Thus, a uniform coating on the surface of such a planar object can be easily achieved on a single pass. The rate at which the object is moved past working portion 413 controls the thickness of the plated material. Alternatively, this embodiment 410 could be used to coat the inside surface of a blind-end tube or cylinder, since the working portion 413 can be easily inserted into the open end of the cylinder and does not require a opening in the blind end to complete the circuit.

Referring now in detail to FIG. 7, the combination cathode and target 412 is made from tube stock of the target material, e.g., aluminum, gold, copper, etc. End plate 416 supports the cathode/target 412 and mounts to some suitable vacuum sputtering chamber (not shown) large enough to accommodate the object 420 being coated. In this special configuration 410, the front end 455 of combination cathode target 412 is necessarily the end that enters the sputtering chamber through insulating feedthroughs 413. Also, the generation of the magnetic field is necessarily done with direct current from a suitable magnet power supply (not shown). Connecter 454 is connected to the negative pole or terminal of the magnet power supply and connecter 452 is connected to the positive terminal of the supply. A suitable coolant can be directed through the tubing as indicated by arrows 456. An important feature of this special configuration 410 is that the plurality of coils 434 form the hollow cathode emission enhancer around the beginning portion 455 of cathode/target 412, thereby eliminating the need for a separate element, thus reducing cost. The "working" portion or loop 413 of cathode 412 extends into the sputtering chamber in a straight line, which is preferred when coating large planar surfaces. The individual tubes 411, 415 comprising working loop 413 should be separated by at least three (3) or four (4) diameters of the tube stock comprising cathode 412, (shown by arrow 441), so that the magnetic field compression and hollow cathode effects will not cause the facing surfaces of these tube portions 411, 415, to be the only parts to sputter. However, there are certain instances where it might be desired to sputter the facing surfaces of the tube portions, such as, for example, when plating both sides of a thin object passing between the loops 411, 415 in a direction perpendicular to the plane of the drawing shown in FIG. 7.

An alternative embodiment 510 to the special embodiment 410 is shown in FIG. 8. Essentially, this embodiment 510 is identical to the embodiment 410 as described above, except that this embodiment 510 has a curved or bent working portion 513 of combination target/cathode 512. The working portion 513 is curved to substantially follow the curved contour of a curved glass plate being passed adjacent working portion 513 perpendicular to the plane of the drawing. The uniform distance between the working portion 513 of the target and the surface 526 of the object 520 being coated allows a uniform coating to be applied with a high deposition efficiency.

It is important to remember that the sputtering target/cathode used in conjunction with the principles of this invention can take numerous forms other than the forms shown and described above for the embodiments 410 and 510. For example, another possible configuration 610 of a sputtering target/cathode 612 is shown in FIG. 9. In this embodiment 610 the cross section of target/cathode 612 is rectangular, as opposed to cylindrical, as was shown for embodiments 410 and 510, nor does the target/cathode 612 double back on itself to form a wand or loop, although it could if the pipe being coated has a blind end, as described above. Such a configuration 610 for the target/cathode would be useful when coating the inside surface of an elongated object, such as a pipe or gun barrel, as the entire cathode 612 can be appropriately sized to fit inside the object being coated. If such a cathode 612 is to be used for DC operation, the hollow cathode emission enhancer 634 need only be placed at the beginning end of the working portion 613 of the cathode 612 and can be formed by bending end 627 of cathode 612 back upon itself, as seen in FIG. 9. If the cathode 612 is to be used for AC operation, a similar hollow cathode emission enhancer could be formed by bending end 629 back upon itself in a "U", similar to end 627. Note that only the target/cathode 612 is shown in FIG. 9, and suitable electrical connections, voltage and current sources, and a suitable sputtering chamber would have to be accommodated similar to those shown and described above for the other embodiments.

Figure 10:
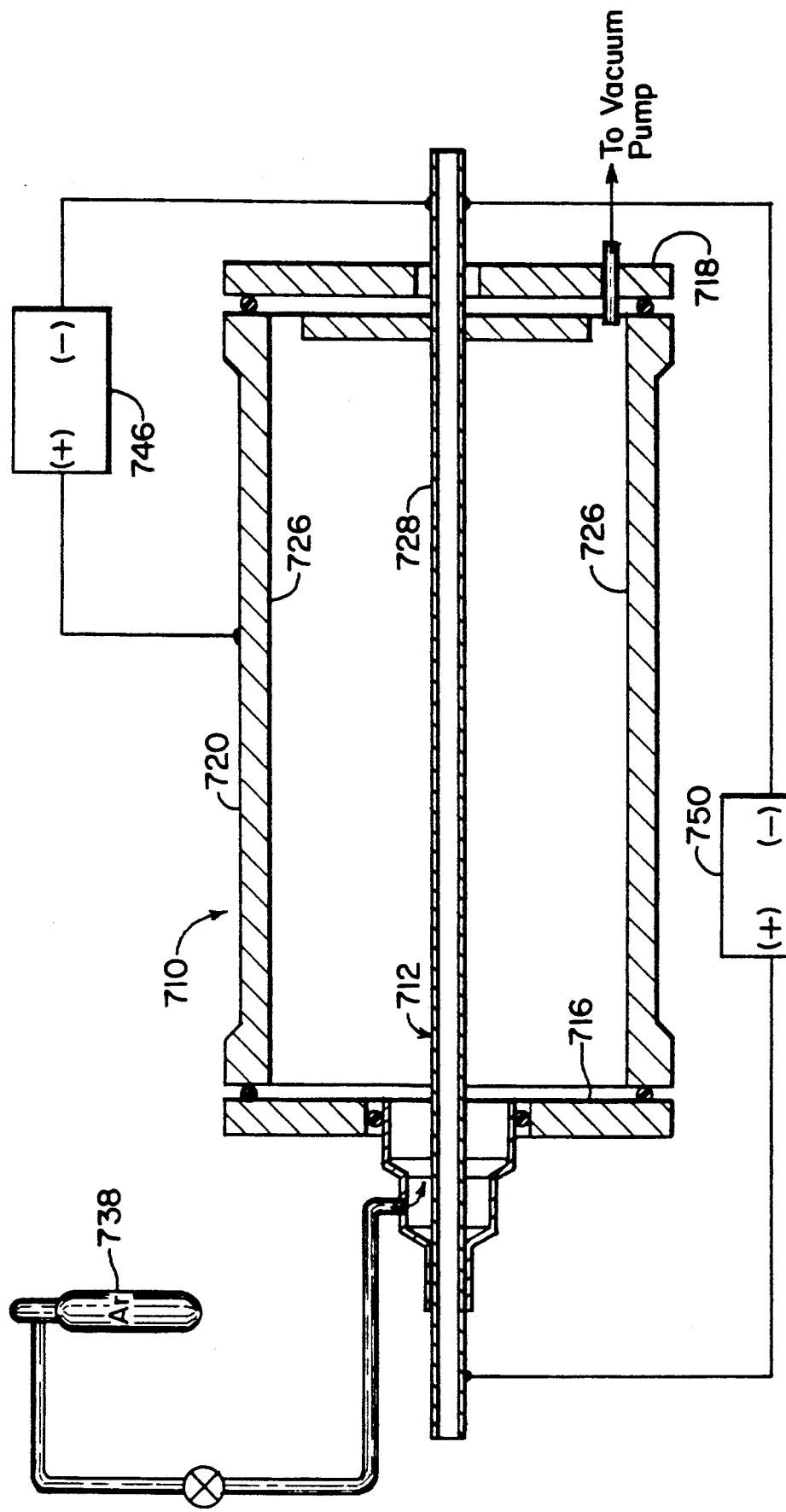
FIG. 10 is a schematic elevational cross-sectional view of a fifth embodiment of a linear magnetron sputtering apparatus according to the present invention, wherein the object being coated forms both the vacuum sputtering chamber and the anode.

Still other configurations for the linear magnetron sputtering apparatus according to the present invention are possible. For example, for the embodiment 710 shown in FIG. 10 is ideal for coating the inside surface 726 of an elongated pipe or tube 720, which pipe or tube 720 also acts as the vacuum coating chamber, thus dispensing with the need for a separate vacuum chamber. Pipe or tube 720 is also connected to voltage source 746, forming the anode, although a separate anode could be used, as described above. Two end plates 716 and 718 would be placed over each end of the pipe 720 to seal the interior and form the sputtering chamber. In this embodiment 710, the end plates 716 and 718 also serve to position and locate the elongated cathode 712 and hollow cathode emission enhancer 734, as seen in FIG. 10.

During operation, the sputtering chamber formed by the walls of pipe 720 and end plates 716 and 718 is evacuated by a vacuum pumping system (not shown), and a suitable inert gas 738 is introduced into the sputtering chamber. The vacuum pumping system is connected to the sputtering chamber via end wall 718 and maintains the sputtering chamber at the desired pressure, as described in detail above. A major advantage of this embodiment 710 is that since the tube or pipe 720 being coated forms the vacuum sputtering chamber, relatively long pipe sections can be easily coated without the need for a prohibitively large and expensive vacuum chamber. For example, this embodiment 710 could be used to coat the inside surfaces of oil well casing pipes, process piping for the petro-chemical, chemical, pharmaceutical, nuclear, waste management, and food and beverage industries, as well as for barrels for injection molding machines, weapons barrels of all sizes and descriptions, tubing for ultra-clean environments, and high pressure tubes and pipes and corrosion resistant reaction vessels.

Another major advantage associated with this embodiment 710 is that it can be used in "reverse" to thoroughly clean the inside surface 726 of pipe 20 by sputtering away any impurities on the surface 726. When used to clean the inside surface 726 of the pipe 720, the pipe 720 is connected as the cathode, while the target material 712 is connected as the anode. A relatively large amount of inert ga 738 flowing through the sputtering chamber must be used to capture the sputtered impurities before they plate themselves to the target-/anode 712 and are removed from the sputtering chamber by the vacuum pumping system. After the inside surface 726 is cleaned in this manner, the electrical connections could be reversed again, with the target 712 reconnected as the cathode and tube 720 reconnected as the anode. This embodiment 710 could now be used to sputter the target material 728 onto the newly cleaned inside surface 726. Since the sputtering operation can be performed immediately following the cleaning operation, the chances of recontaminating the inside surface 726 are minimized.

Finally, by selectively and intermittently reversing the connections as described above, i.e., alternately making the tube 720 and target 728 be the anode and cathode, a gradient film of target material 728 can be deposited on the inside surface 726, varying in composition from 100% of the pipe composition at the surface of the pipe to 100% of the target material composition 728 at the surface of the deposited coating.

This concludes the detailed descriptions of the various embodiments and special configurations of the linear magnetron sputtering apparatus of the present invention. Note that numerous arrangements of the components of the linear magnetron sputtering apparatus according to this invention are possible, and many other arrangements that are not shown and described herein would be obvious to those persons having ordinary skill in the art after becoming familiar with the details of this invention. For example, four different types of electron emission enhances have been shown and described herein, but many other variations are possible and fall within the scope of this invention. Further, it should be noted that this invention is not limited to coating only large planar surfaces, curved glass plates, or tubes and cylinders. On the contrary, the embodiments described herein could be easily modified to uniformly coat myriad other objects.

It should also be remembered that the "deposition" inefficiencies referred to herein apply to all types of sputtering apparatus. That is, any time atoms are sputtered from a target surface, a portion will always wind up being deposited on other surfaces besides the surface being coated. These coupling losses make it important to minimize the distance between the target and surface being coated. The conformable target according to this invention ensures that the target-to-surface distance can always be minimized, thereby maximizing the deposition or coupling efficiency.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to falling within the scope of the invention as defined by the claims which follow.

The embodiments of the invention in which an exclusive property or privilege is claimed are defined as follows:

1. Sputtering apparatus for producing a thin film on the surface of an object, comprising:
    an elongated cathode terminating in first and second end sections;
    a target material surrounding said elongated cathode as a sputtering surface;
    electron emission enhancing means in radially spaced relation to the first end section of said elongated, wherein said electron emission enhancing means includes a surface positioned in substantially radially opposed relation to the first end section of said elongated cathode, whereby the surface substantially faces and is exposed to the first end section of said elongated cathode, for creating electron saturation at the sputtering surface of said target material that is adjacent said electron emission enhancing means; and
    means for applying an electric current through said elongated cathode for generating a magnetic field having magnetic force vectors directed circumferentially around said elongated cathode and said target material.

2. The sputtering apparatus of claim 1, wherein said electron emission enhancing means includes a coaxial hollow cathode mounted to the first end section of said elongated cathode and electrically connected thereto and wherein said coaxial hollow cathode substantially encircles the first end section of said elongated cathode.

3. The sputtering apparatus of claim 2, wherein said means for applying an electric current through said elongated cathode includes a low voltage DC magnetic field current source having its negative terminal connected to the first end section of said elongated cathode and its positive terminal connected to the second end section of said elongated cathode.

4. The sputtering apparatus of claim 3, wherein said elongated cathode is hollow.

5. The sputtering apparatus of claim 4, wherein said elongated cathode is made entirely of said target material such that said elongated cathode and said target material comprise a unitary homogenous component.

6. The sputtering apparatus of claim 5, comprising:
    an air-tight sputtering chamber adapted to house said elongated cathode and said object;
    an anode; and
    a DC high voltage sputtering supply having a negative terminal connected to the first end section of said elongated cathode and having a positive terminal connected to said anode.

7. The sputtering apparatus of claim 6, including means for introducing a sputtering gas into said sputtering chamber at a predetermined pressure.

8. The sputtering apparatus of claim 7, including means for circulating coolant through said elongated cathode.

9. The sputtering apparatus of claim 8, wherein said sputtering chamber is connected to said DC high voltage sputtering supply as said anode.

10. The sputtering apparatus of claim 8, wherein said anode is located at about the first end of said elongated cathode.

11. The sputtering apparatus of claim 8, wherein said anode is located at about the second end of said elongated cathode.

12. The sputtering apparatus of claim 8, wherein said anode includes a first trimming anode located at about the first end section of said elongated cathode and a second trimming anode located at about the second end section of said elongated cathode and wherein said first and second trimming anodes are connected together to said DC high voltage sputtering supply through a voltage divider, such that the potential between said first and second trimming anodes and said elongated cathode can be varied.

13. The sputtering apparatus of claim 1, including end terminator means connected to the second end section of said elongated cathode for intercepting electrons from the sputtering surface of said target material.

14. The sputtering apparatus of claim 1, wherein said electron emission enhancing means includes a coaxial hollow cathode mounted to the first end section of said elongated cathode and electrically connected thereto and wherein said coaxial hollow cathode substantially encircles the first end section of said elongated cathode and said target material and wherein said end terminator means includes a coaxial hollow end terminator shell mounted to the second end section of said elongated cathode and electrically connected thereto and wherein said hollow end terminator shell substantially encircles the second end section of said elongated cathode and said target material.

15. The sputtering apparatus of claim 14, wherein said means for applying an electric current through said elongated cathode includes a low voltage AC magnetic field current source having a first terminal connected to the first end section of said elongated cathode and a second terminal connected to the second end section of said elongated cathode.

16. The sputtering apparatus of claim 15, wherein said elongated cathode is hollow.

17. The sputtering apparatus of claim 16, wherein said elongated cathode is made entirely of said target material such that said elongated cathode and said target material comprise a unitary homogenous component.

18. The sputtering apparatus of claim 17, comprising:
an air-tight sputtering chamber adapted to house said elongated cathode and said object;
an anode; and
a DC high voltage sputtering supply having a negative terminal connected to the first end section of said elongated cathode and having a positive terminal connected to said anode.

19. The sputtering apparatus of claim 18, including means for introducing a sputtering gas into said sputtering chamber at a predetermined pressure.

20. The sputtering apparatus of claim 19, including means for circulating coolant through said elongated cathode.

21. The sputtering apparatus of claim 20, wherein said sputtering chamber is connected to said DC high voltage sputtering supply as said anode.

22. The sputtering apparatus of claim 20, wherein said anode is located at about the first end section of said elongated cathode.

23. The sputtering apparatus of claim 20, wherein said anode is located at about the second end section of said elongated cathode.

24. The sputtering apparatus of claim 20, wherein said anode includes a first trimming anode located at about the first end section of said elongated cathode and a second trimming anode located at about the second end section of said elongated cathode and wherein said first and second trimming anodes are connected together to said DC high voltage sputtering supply through a voltage divider, such that the potential between said first and second trimming anodes and said elongated cathode can be varied.

25. The sputtering apparatus of claim 1, wherein said electron emission enhancing means comprises:
an electron emission enhancing plate located in proximate, radially spaced relation to the first end of said elongated cathode; and
electron source power supply means connected to said electron emission enhancing plate for enhancing the emission of electrons at the sputtering surface of said target material.

26. The sputtering apparatus of claim 1, wherein the object forms an air-tight sputtering chamber that encloses said elongated cathode and wherein said sputtering apparatus includes a DC high voltage sputtering supply having a negative terminal connected to the first end section of said elongated cathode and having a positive terminal connected to the object to form an anode.

27. The sputtering apparatus of claim 26, including means for introducing a sputtering gas into said sputtering chamber at a predetermined pressure.

28. The sputtering apparatus of claim 27, including means for circulating coolant through said elongated cathode.

29. The sputtering apparatus of claim 1, wherein the object forms an air-tight sputtering chamber that encloses said elongated cathode and wherein said elongated cathode is connected electrically in reverse to function as an electrical anode with said sputtering chamber connected as an electrical cathode to sputter from the object.

30. The sputtering apparatus of claim 1, wherein the object forms an air-tight sputtering chamber that encloses said elongated cathode and wherein said elongated cathode and said sputtering chamber are connectable alternately as a cathode and as an anode, respectively, and vice-versa, such that said target material and the object can be sputtered alternately.

31. The sputtering apparatus of claim 1, wherein said electron emission enhancing means includes hollow cathode means electrically connected to said elongated cathode and mounted in spaced apart lateral relation to the first end section of said elongated cathode.

32. The sputtering apparatus of claim 31, wherein said hollow cathode means has a portion of said first end section of said elongated cathode bent back over itself to form a bent back first end section such that there is a space between said elongated cathode and the bent back first end section.

33. The sputtering apparatus of claim 31, wherein said hollow cathode means comprises a first portion of said first end section of said elongated cathode coiled around a second portion of said elongated cathode at about said first end section such that there is an annular space between said second portion and the coiled first end portion.

34. Sputtering apparatus for producing a thin film on a surface of an object, comprising:

an elongated cathode made of tubular material that is formed in an elongated U-shaped loop, one end of which loop is an elongated working end section with a sputtering surface and another end of which includes a coil of said tubular material encircling a front section of said tubular material in radially spaced relation to said sputtering surface for creating electron saturation at said sputtering surface; and means for applying an electric current through said elongated cathode to generate a magnetic field with magnetic lines of force oriented circumferentially around said sputtering surface.

35. The sputtering apparatus of claim 34, wherein said surface of said object has a contour and is positioned proximate to said working end section and wherein said working end section is formed in a shape that conforms substantially to said contour of said surface of said object.

36. A method of depositing a thin film onto the surface of an object within an emission enhanced cathode sputtering apparatus, comprising the steps of:

providing an elongated cathode, a target material surrounding the elongated cathode and in electrical contact therewith to form a sputtering surface, and at least one anode remotely located from the elongated cathode;

creating electron saturation at the sputtering surface of the target material;

applying an electric current through the elongated cathode to generate a magnetic field having magnetic force vectors oriented to wrap circumferentially around the elongated cathode and the sputtering surface; and generating a plasma sheath around the sputtering surface.

37. Sputtering apparatus for producing a thin film on the surface of an object, comprising:

an elongated target cathode having a sputtering surface and a first end section and a second end section, wherein said first end section is bent back on itself in a "U" shape such that there is a space between said elongated target cathode and the bent back first end section to form a hollow cathode electron emission enhancer section for producing electron saturation at said sputtering surface; and means for applying an electric current through said elongated target cathode to generate a magnetic field that has magnetic lines of force extending circumferentially around said elongated target cathode.

38. Magnetically enhanced sputtering apparatus for producing a thin film on the surface of an object, comprising:

an elongated cathode terminating in first and second end sections;

a target material surrounding said elongated cathode and in electrical contact therewith and forming a sputtering surface;

electron emission enhancement means positioned in radially spaced apart relation to the first end section of said elongated cathode for creating electron saturation at the sputtering surface of said target material that is adjacent said electron emission enhancement means; and means for applying an electric current through said elongated cathode for generating a magnetic field having magnetic force vectors directed circumferentially around said elongated cathode and said target material.

39. The magnetically enhanced sputtering apparatus of claim 38, wherein said electron emission enhancement means is formed by bending said first end section of said elongated cathode back on itself, such that there is a space between said elongated cathode and the bent back first end section.

40. The magnetically enhanced sputtering apparatus of claim 38, wherein said electron emission enhancement means is formed by coiling said first end section of said elongated cathode around said elongated cathode at about said first end section, such that there is an annular space between said first end section and the coils formed by coiling said first end section.

41. The magnetically enhanced sputtering apparatus of claim 38, wherein said electron emission enhancement means comprises:

an electron emission enhancing electrode located at about the first end of said elongated cathode; and electron source power supply means connected to said electron emission enhancing electrode for producing electron saturation at the sputtering surface of said target material adjacent said electron emission enhancing electrode.

42. The magnetically enhanced sputtering apparatus of claim 38, wherein said electron emission enhancement means comprises a hollow cathode surface that substantially encircles the first end section of said elongated cathode.

43. The emission enhanced sputtering cathode apparatus of claim 38, wherein said means for applying an electric current through said elongated cathode includes a low voltage DC magnetic field current source having its negative terminal connected to the first end section of said elongated cathode and its positive terminal connected to the second end section of said elongated cathode.

44. The magnetically enhanced sputtering apparatus as recited in claim 38, further comprising:

a sputtering chamber adapted to house said magnetically enhanced sputtering cathode and said object;

an anode; and a high voltage plasma generating supply having a negative terminal connected to the first end section of said elongated cathode and having a positive terminal connected to said anode.

45. The sputtering apparatus of claim 44, wherein said chamber is said anode.

46. A sputtering apparatus, comprising:

an elongated, electrically conductive cathode having a first end and a second end; a target material to be sputtered positioned on said cathode;

magnetic field producing current source means connected to said cathode in a manner that causes current to flow from said first end of said cathode toward said second end of said cathode for creating a magnetic field along the length of said cathode and having magnetic field vectors directed circumferentially around said cathode;

electron enhancement means positioned at said first end of cathode for creating electron saturation at said cathode adjacent said electron enhancement means;

anode means positioned in proximity to said cathode and to said electron enhancement means; and sputtering power source means connected to said cathode and to said anode in such a manner that said cathode and said electron enhancement means are opposite in electric polarity to said anode for producing electrons in a glow discharge in said magnetic field around said cathode.

47. The sputtering apparatus of claim 46, wherein said electron enhancement means is a hollow cathode piece surrounding said first end or said second end of said elongated cathode and said anode is an annular ring positioned around said elongated cathode adjacent said hollow cathode piece.

* * * * *

UNITED STATES PATENT AND TRADEMARK OFFICE
CERTIFICATE OF CORRECTION

PATENT NO. : 5,298,137
DATED : March 29, 1994
INVENTOR(S) : John Marshall, III

It is certified that error appears in the above-indentified patent and that said Letters Patent is hereby corrected as shown below:

In column 6, line 13, change "man" to --many--.

In column 6, line 63, after "tight" insert --,--.

In column 9, line 7, change "B" to --$\vec{B}$--.

In column 9, line 29, change "E" to --$\vec{E}$--.

In column 9, line 41, change "EX$\vec{B}$" to --$\vec{E}$X$\vec{B}$--

In column 9, line 41, after "velocity" insert --)--.

In column 10, line 40, change "cathode/-" to --cathode/--.

In column 12, line 23, change "o" to --of--.

UNITED STATES PATENT AND TRADEMARK OFFICE
CERTIFICATE OF CORRECTION

PATENT NO. : 5,298,137
DATED : March 29, 1994
INVENTOR(S) : John Marshall, III

It is certified that error appears in the above-indentified patent and that said Letters Patent is hereby corrected as shown below:

In column 15, line 15, change "ga" to --gas--.

In column 15, line 27, change "recontaminating" to --re-contaminating--.

In column 16, line 17, after "elongated" insert --cathode--.

In column 18, line 68, delete --end--.

In column 20, line 34, change "emission" to --magnetically-- and delete "cathode".

Signed and Sealed this

Twenty-sixth Day of September, 1995

Attest:

BRUCE LEHMAN

Attesting Officer    Commissioner of Patents and Trademarks